United States Patent

Yoshizumi et al.

[11] Patent Number: 5,610,856
[45] Date of Patent: Mar. 11, 1997

[54] SEMICONDUCTOR INTEGRATED CIRCUIT DEVICE

[75] Inventors: Keiichi Yoshizumi, Kokubunji; Satoru Haga, Akishima; Shuji Ikeda, Koganei, all of Japan; Kiichi Makuta, Dallas, Tex.; Takeshi Fukazawa, Tsukui-machi, Japan

[73] Assignees: Hitachi, Ltd.; Hitachi ULSI Engineering Corp., both of Tokyo, Japan

[21] Appl. No.: 610,185

[22] Filed: Mar. 4, 1996

[30] Foreign Application Priority Data

Mar. 7, 1995 [JP] Japan .................................. 7-047365

[51] Int. Cl.⁶ .................................................. G11C 11/40
[52] U.S. Cl. ............................ 365/154; 365/156; 257/904
[58] Field of Search ..................................... 365/154, 182, 365/156; 257/904, 903

[56] References Cited

U.S. PATENT DOCUMENTS 4,805,147  2/1989  Yamanaka et al. ................... 365/154
4,853,894  8/1989  Yamanaka et al. ................... 365/154
5,122,857  6/1992  Ikeda et al. ....................... 365/189.03
5,281,843  1/1994  Ochii ............................... 365/154
5,377,139  12/1994  Lage ............................... 365/154

*Primary Examiner*—David C. Nelms
*Assistant Examiner*—Son Mai
*Attorney, Agent, or Firm*—Antonelli, Terry, Stout & Kraus, LLP

[57] ABSTRACT

An increase in the GND resistance and a drop in the resistance against electromigration are minimized when the ground voltage lines for shunting are finely constituted by using an Al wiring of the same layer as the pad layer, owing to the employment of a layout in which the arrangement of connection holes 24, 26 in a pad layer connected to one (data line) of the complementary data lines and the arrangement of connection holes in a pad layer connected to the other one (data line bar) of the complementary data lines, are inverted from each other every two bits of memory cells in the SRAM along the direction in which the complementary data lines extend.

10 Claims, 12 Drawing Sheets

SEMICONDUCTOR INTEGRATED CIRCUIT DEVICE

BACKGROUND OF THE INVENTION

The present invention relates to a semiconductor integrated circuit device and to technology for its production. In particular, the invention relates to technology that can be effectively adapted to a semiconductor integrated circuit device having an SRAM (static random access memory).

The SRAM which works as a semiconductor storage device has memory cells each constituted by a flip-flop circuit and two transfer MISFETs (metal insulator semiconductor field-effect transistors) at a point where a word line and a pair of complementary data lines intersect each other.

The flip-flop circuit is constituted by, for example, two drive MISFETs and two high-resistance load elements, and stores data of one bit. Gate electrodes of the two drive MISFETs are connected to the drain regions of the other drive MISFETs, respectively, and the source regions are fixed to ground potential (GND). The two high-resistance load elements are connected at their ends on one side to the drain regions of the drive MISFETs, and are subjected at their ends on the other side to a power source voltage (Vcc).

The source region of one transfer MISFET is connected to the drain region of one drive MISFET, and the source region of the other transfer MISFET is connected to the drain region of the other drive MISFET. Complementary data lines are connected to the drain regions of the two transfer MISFETs, and the word line is connected to respective gate electrodes.

In a memory cell of an SRAM disclosed in U.S. Pat. No. 4,853,894, the gate electrodes of drive MISFETs and transfer MISFETs and the word line are constituted by a polycrystalline silicon film of a first layer, and the high-resistance load elements are constituted by a polycrystalline silicon film of a second layer. Ground voltage lines for fixing the source regions of drive MISFETs to ground potential are constituted by a polycrystalline silicon film of a third layer, and the data line is constituted by an aluminum (Al) wiring formed on the ground voltage lines.

In this SRAM, the high-resistance load elements are electrostatically shielded by the ground voltage lines, so that the amounts of electric current flowing into the high-resistance load elements are prevented from changing. Moreover, a capacitance element is constituted by the ground voltage lines, part of the second polycrystalline silicon film layer (low-resistance portions at both ends of the high-resistance load elements) of the second layer, and an insulating film therebetween. The electric charge of the capacitance element is fed to a charge-accumulating node of the memory cell to improve resistance against soft error caused by a particles. The SRAM having capacitance element has also been disclosed in, for example, U.S. Pat. No. 4,805,147.

Owing to their high-speed performance, the SRAMs of this kind have been used for main memories and cache memories of computers in recent years. To realize the operation at higher speeds, however, it is essential to employ wiring of a multilayer structure. Concretely speaking, the data lines must be constituted by a low-resistance metal wiring such as Al wiring, and the word lines and the ground voltage lines constituted by a polycrystalline silicon film must be shunted by a low-resistance metal wiring, in order to increase the speed of data writing operation and reading operation.

In the SRAM disclosed in the above-mentioned publication, for example, an aluminum wiring of a double-layer structure is used to shunt the word lines and the ground voltage lines. The main word line (word line for shunting) and the ground voltage lines for shunting are constituted by the Al wiring of the first layer, and the data lines are constituted by the Al wiring of the second layer.

Here, the main word lines are provided at a rate of, for example, one line per 4 bits of memory cells, and are connected to the word lines at a word decoder neighboring the memory array. On the other hand, the ground voltage line for shunting and the ground voltage line are connected together for each memory cell through a connection hole formed in an insulating film that isolates the two from each other. When the data lines are constituted by the Al wiring of the second layer, the connection hole for connecting the drain region of the transfer MISFET and the data line together possesses an increased aspect ratio which deteriorates reliability in the conduction of data line inside the connection hole. Accordingly, the pad layers are constituted by the Al wiring of the first layer, and the drain regions of the transfer MISFETs and the data lines are connected together via the pad layers. An SRAM having a two-layer Al structure has been disclosed in, for example, U.S. Pat. No. 5,122,857.

SUMMARY OF THE INVENTION

According to the study conducted by the present inventors, however, the following problems arise when it is attempted to further increase the degree of integration of memory cells by finely constructing the SRAM of the above-mentioned two-layer Al wiring structure.

(1) In this SRAM, the ground voltage wires for shunting, main word lines and pad layers for connecting the data lines to the drain regions of the transfer MISFETs, are constituted by the Al wiring of the first layer, and the data lines are constituted by the Al wiring of the second layer.

In this case, the ground voltage lines for shunting are arranged at a rate of one line per two bits of memory cells arranged along a direction in which the data lines extend, and extend in a direction to intersect the direction in which the data lines extend. The main word lines are arranged at a rate of one line per four bits (four pieces) of memory cells arranged along a direction in which the data lines extend, and extend in a direction to intersect the direction in which the data lines extend, like the ground voltage lines for shunting. The pad layers are arranged at a rate of one layer per two bits of memory cells arranged along a direction in which the data lines extend.

That is, the grounding voltage lines for shunting, main word lines and pad layers are arranged in a recurring pattern of pad layer, ground voltage line for shunting, pad layer, ground voltage line for shunting and main word line every four bits (four pieces) of memory cells that are arranged along the direction in which the data lines extend. Here, the distance is the same between the pad layers along the direction in which the data lines extend. Of the above-mentioned two ground voltage lines for shunting, therefore, the first ground voltage line for shunting sandwiched between the pad layer and the main word line has a width smaller than the width of the second ground voltage line for shunting sandwiched between the pad layer and another pad layer by an amount corresponding to space between the main word line and the ground voltage line for shunting.

As the memory cells are constructed in ever finer sizes, therefore, the first ground voltage line for shunting having a small width exhibits an increased GND resistance, whereby the power source voltage margin decreases to impair reliability in the operation of the memory cells. Besides, aluminum constituting the first ground voltage line for shunting exhibits decreased resistance against electromigration and lowers reliability of the line.

(2) The gate electrode of another drive MISFET is connected to the drain region of the drive MISFET that constitutes the memory cell in the SRAM. The gate electrodes of the drive MISFETs are constituted by the polycrsytalline silicon film of the first layer. Therefore, the gate electrode of one drive MISFET is connected to the drain region of the other drive MISFET through a first connection hole formed on the drain region of the other drive MISFET. Moreover, the ground voltage lines for shunting are connected to the source regions of the drive MISFETs through second connection holes formed in the insulating film on the source regions.

As the memory cells are constructed in ever finer sizes, therefore, a fitting margin decreases between the gate electrodes of the drive MISFETs and the second connection holes formed on the source regions of the drive MISFETs, whereby the contact area decreases between the gate electrode of one drive MISFET connected through the above-mentioned first connection hole and the drain region of the other drive MISFET, causing the connection to become defective.

An object of the present invention is to provide technology that is capable of finely constructing memory cells of an SRAM.

Another object of the present invention is to provide technology capable of realizing memory cells of an SRAM, that operate at high speeds.

The above and other objects as well as novel features of the present invention will become obvious from the description of the specification and the accompanying drawings.

Briefly described below are representative examples of the invention disclosed in this application.

(1) A semiconductor integrated circuit device of the present invention has an SRAM wherein a memory cell is constituted by a flip-flop circuit and two transfer MISFETs arranged at a portion where a word line and a pair of complementary data lines intersect each other; a metal wiring of a first layer formed on said memory cell constitutes ground voltage lines, pad layers, and a main word line that is arranged at a rate of one line per four bits of memory cells arranged along a direction in which said complementary data lines extend; said complementary data lines are constituted by a metal wiring of a second layer formed on the metal wiring of said first layer; said complementary data lines and said pad layers are electrically connected together through first connection holes formed in an interlayer insulating film that is formed between said complementary data lines and said pad layers, and said pad layers and the drain regions of said transfer MISFETs are electrically connected together through second connection holes formed in an insulating film that is formed between said pad layers and said transfer MISFETs; and wherein the arrangement of said first and second connection holes in said pad layer connected to one of said complementary data lines and the arrangement of said first and second connection holes in said pad layer connected to the other one of said complementary data lines, are inverted from each other every two bits of said memory cells (two memory cells) that are arranged along a direction in which said complementary data lines extend.

(2) A semiconductor integrated circuit device of the present invention has an SRAM wherein a memory cell is constituted by two transfer MISFETs and a flip-flop circuit made up of two drive MISFETs and two high-resistance load elements arranged at a portion where a word line and a pair of complementary data lines intersect each other; the gate electrodes of said drive MISFETs, the gate electrodes of said transfer MISFETs, and said word line are constituted by a polycrystalline silicon film or a polycide film of a first layer formed on a semiconductor substrate; said high-resistance load elements are constituted by a polycrystalline silicon film of a second layer formed on said driving MISFETs; plate electrodes covering said high-resistance load elements are constituted by a polycrystalline silicon film or a polycide film of a third layer formed on said high-resistance load elements; ground voltage lines are constituted by a metal wiring formed on said plate electrodes; and said ground voltage lines and the source regions of said drive MISFETs are electrically connected together via said plate electrodes.

(3) In a semiconductor integrated circuit device of the present invention, the number of connection holes for connecting said plate electrodes to said ground voltage lines of the upper layer is larger than the number of connection holes for connecting said plate electrodes to the source regions of said drive MISFETs of the lower layer.

According to the above-mentioned means (1), it is possible to increase a minimum width of the ground voltage lines for shunting compared with the case where arrangements of the first and second connection holes in the pad layer connected to one of the complementary data lines and the first and second connection holes in the pad layer connected to the other one of the complementary data lines are kept constant. This makes it possible to minimize the increase in the GND resistance and the drop in the resistance against electromigration when the ground voltage liner for shunting are finely formed.

According to the above-mentioned means (2), the ground voltage lines and the source regions of the drive MISFETs are connected together via plate electrodes of a large area covering the high-resistance load elements, enabling the source regions of the drive MISFETs and the plate electrodes to be connected together in a self-aligned manner. This makes it possible to sufficiently ensure fitting margin between the gate electrodes of the drive MISFETs and the connection holes formed on the source regions and, hence, to increase the contact area between the gate electrode of one drive MISFET and the drain region of the other drive MISFET.

According to the above-mentioned means (3), it is possible to increase the contact area between the plate electrodes and the ground voltage lines of the upper layer and to decrease the GND resistance.

DETAILED DESCRIPTION OF THE PREFERRED EMBODIMENTS

Embodiment 1

Figure 1:
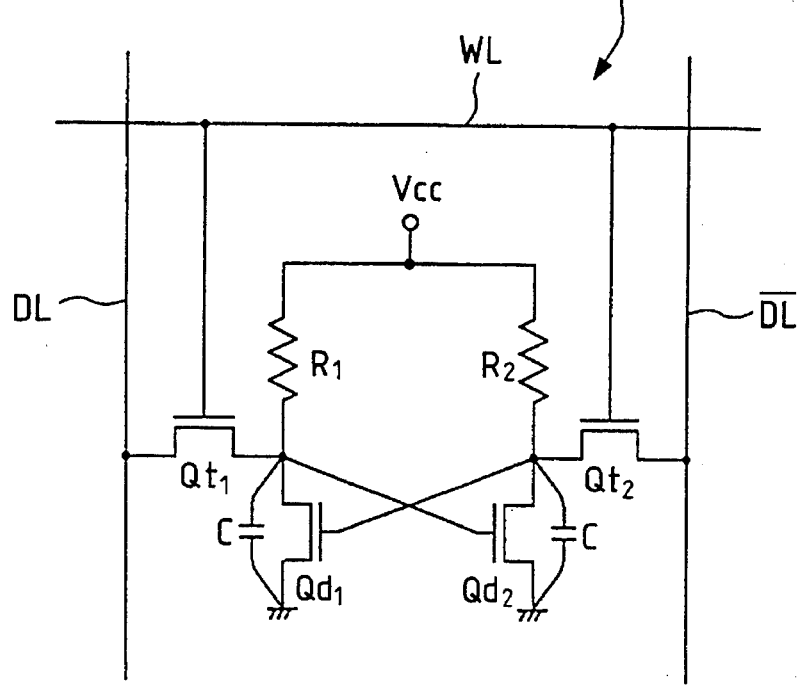
FIG. 1 is a diagram illustrating an equivalent circuit of a memory cell in an SRAM according to an embodiment of the present invention.

FIG. 1 is a diagram of an equivalent circuit illustrating a memory cell MC in an SRAM according to an embodiment of the present invention. As shown, the memory cell MC in the SRAM is constituted by a flip-flop circuit and two transfer MISFETs Qt1, Qt2 disposed at an intersecting portion of a pair of complementary data lines (data line DL, data line bar DL) and a word line WL. The memory cell MC stores the data of one bit.

The flip-flop circuit is constituted by coupling, in a crossing manner, a pair of inverter circuits constituted by two drive MISFETs Qd1, Qd2 and two high-resistance load elements R1, R2 serving as load elements. That is, the gate electrodes of the two drive MISFETs Qd1, Qd2 are connected to the drain regions of the other drive MISFETs Qd1, Qd2, and the high-resistance load elements R1, R2 are connected at their ends on one side to the drain regions. The source regions of the drive MISFETs Qd1, Qd2 are fixed to ground potential (GND), and a power source voltage (Vcc) is applied to the ends on the other side of the high-resistance load elements R1, R2. In the drawing, symbol C denotes a capacitor element that will be described later.

One input/output terminal (drain region of drive MISFET Qd1) of the flip-flop circuit is connected to the source region of the transfer MISFET Qt1, and the other input/output terminal thereof (drain region of drive MISFET Qd2) is connected to the source region of the transfer MISFET Qt2. The data line DL is connected to the drain region of the transfer MISFET Qt1, and the data line bar DL is connected to the drain region of the transfer MISFET Qt2.

Figure 2:
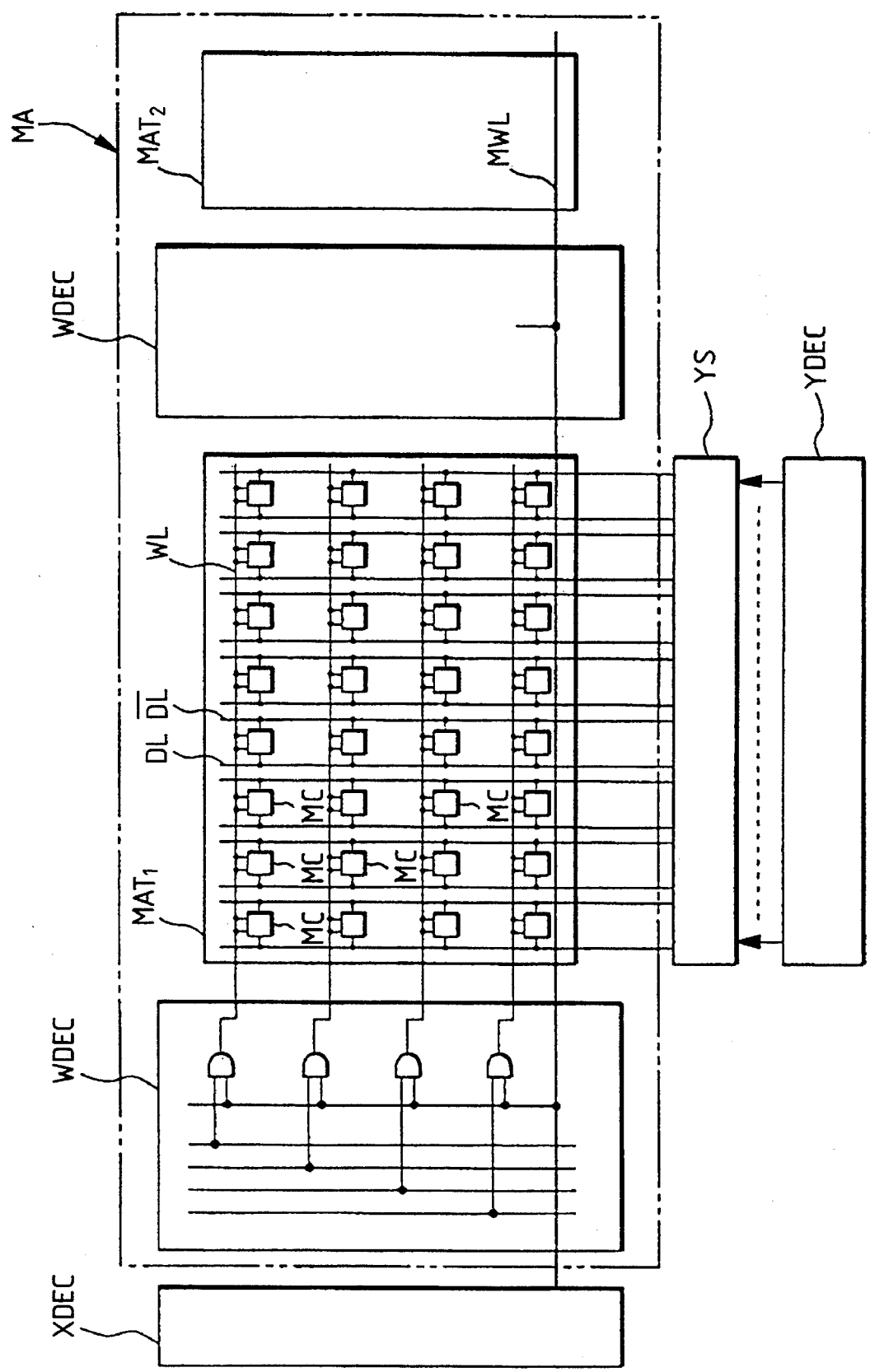
FIG. 2 is a diagram illustrating the structure of a memory array in the SRAM according to the embodiment of the present invention.

FIG. 2 is a diagram illustrating the constitution of a memory array of the SRAM according to the embodiment, wherein the memory array MA is divided into a plurality of memory mats MAT (MAT1, MAT2, —). Each memory mat MAT includes a plurality of word lines WL running along the direction of column and a plurality of complementary data lines (data lines DL, data lines bar DL) running along the direction of row. The memory cell MC shown in FIG. 1 is disposed at each intersecting point of these complementary data lines (data lines DL, data lines bar DL) and the word lines WL.

Each memory mat MAT includes a main word line MWL that extends along the direction of column. The main word lines MWL are arranged at a rate of one per four word lines WL (four memory cells MC), and are connected to the word lines WL in a word decoder WDEC arranged neighboring each memory mat MAT.

An end of the main word line MWL is connected to an X-decoder XDEC. Ends on one side of the complementary data lines (data line DL, data line bar DL) are connected to a Y-decoder YDEC via a Y-selection switch YS. Any memory cell MC is selected by the X-decoder XDEC and by the Y-decoder YDEC.

Figure 7:
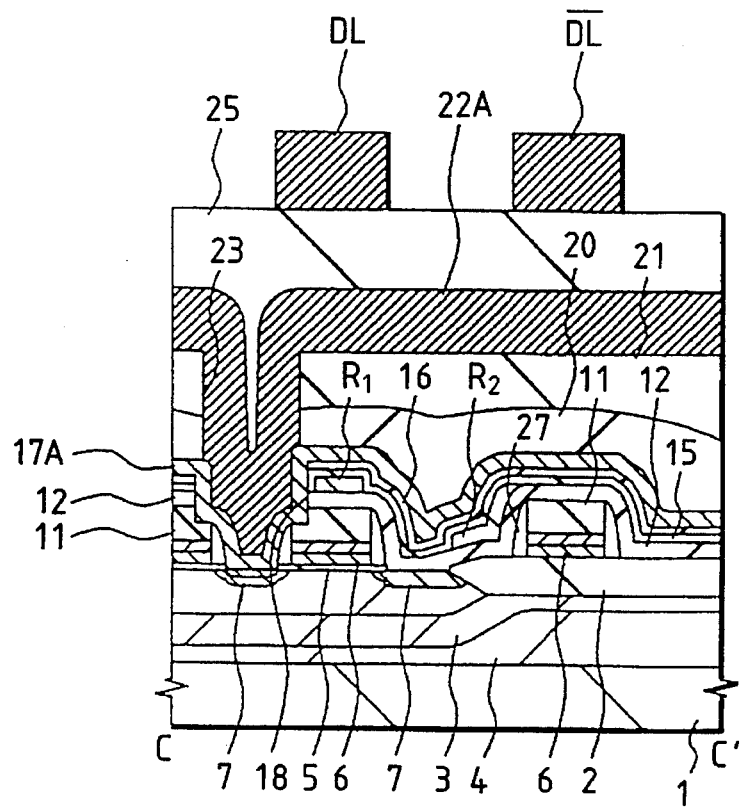
FIG. 7 is a sectional view of a semiconductor substrate along the line C—C' in FIGS. 3 and 4.
Figure 3:
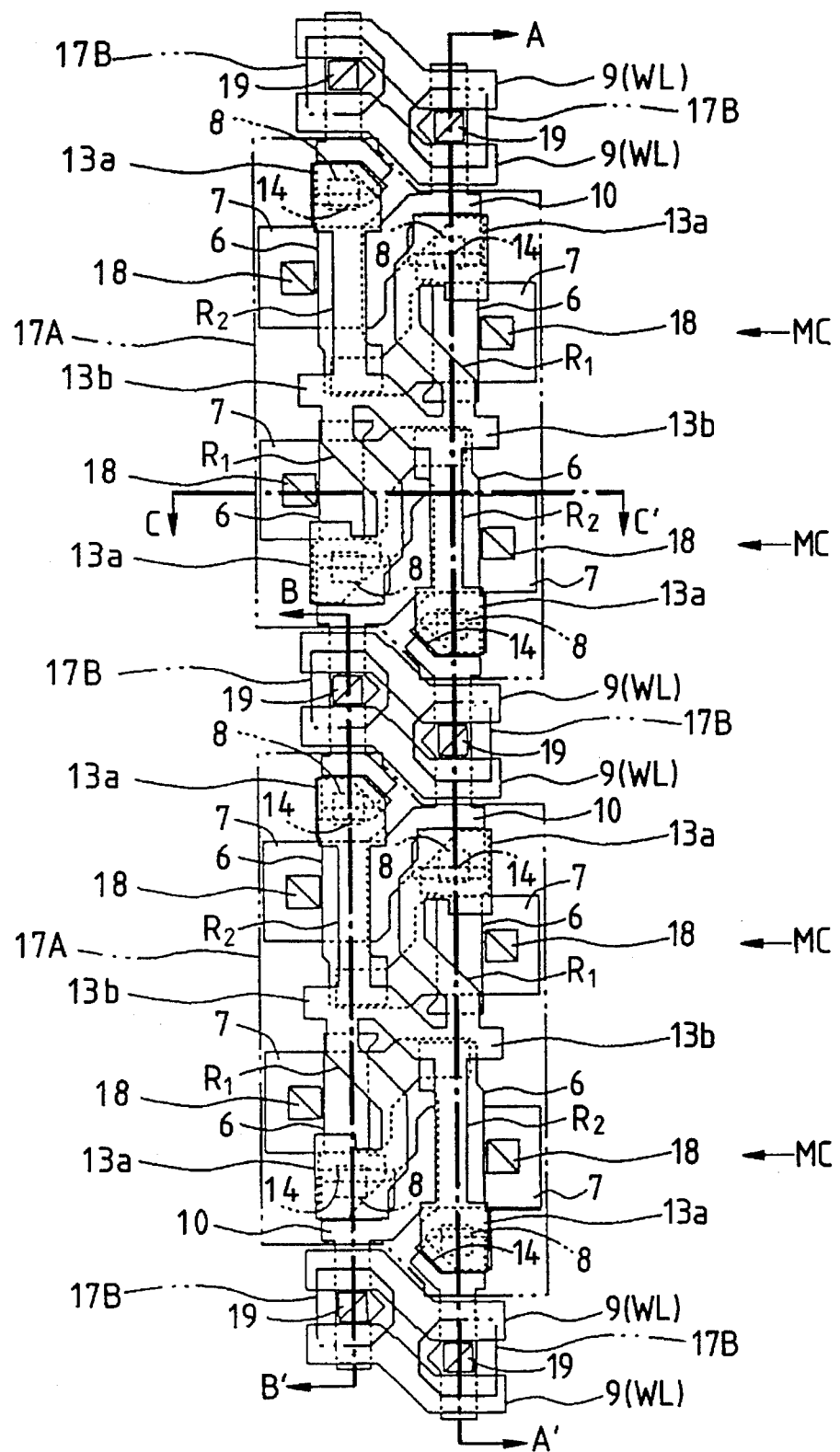
FIG. 3 is a plan view illustrating an electrically conducting layer of about four bits of the memory cells arranged along a direction in which the complementary data lines extend.
Figure 4:
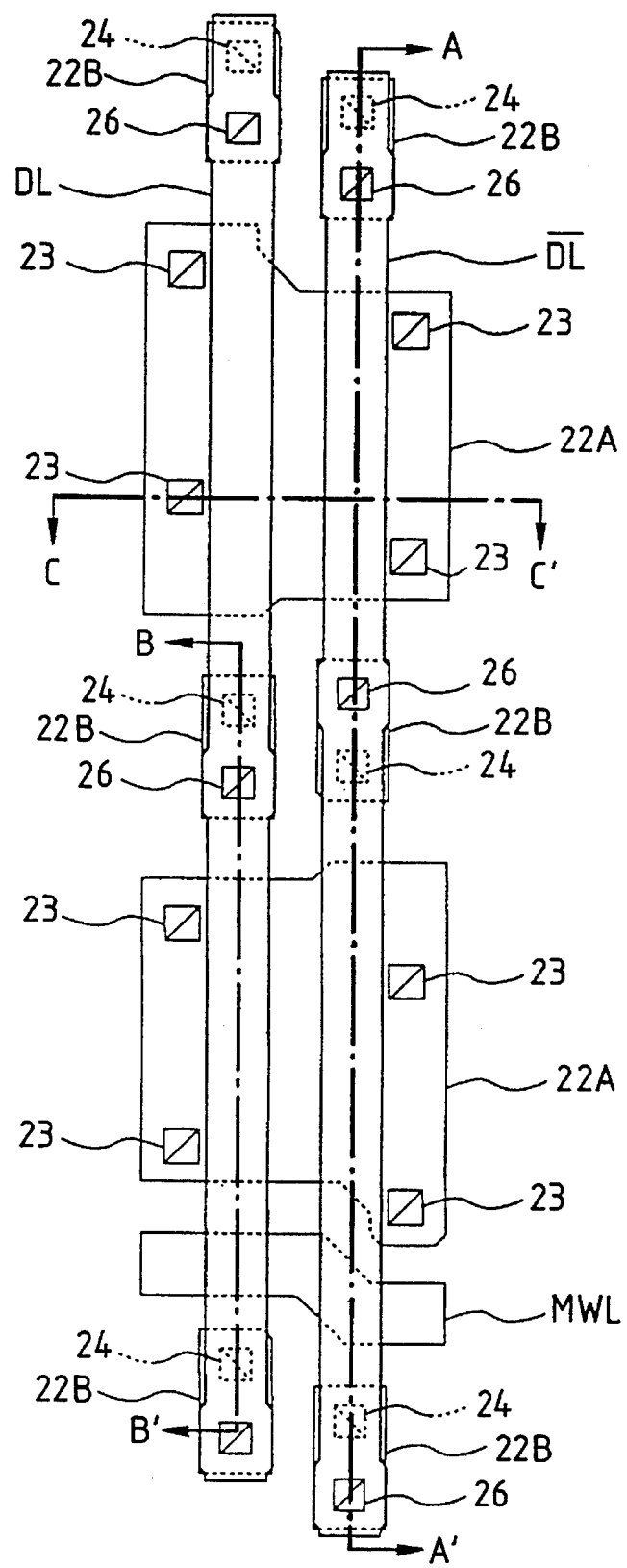
FIG. 4 is a plan view illustrating an electrically conducting layer of about four bits of the memory cells arranged along the direction in which the complementary data lines extend.
Figure 5:
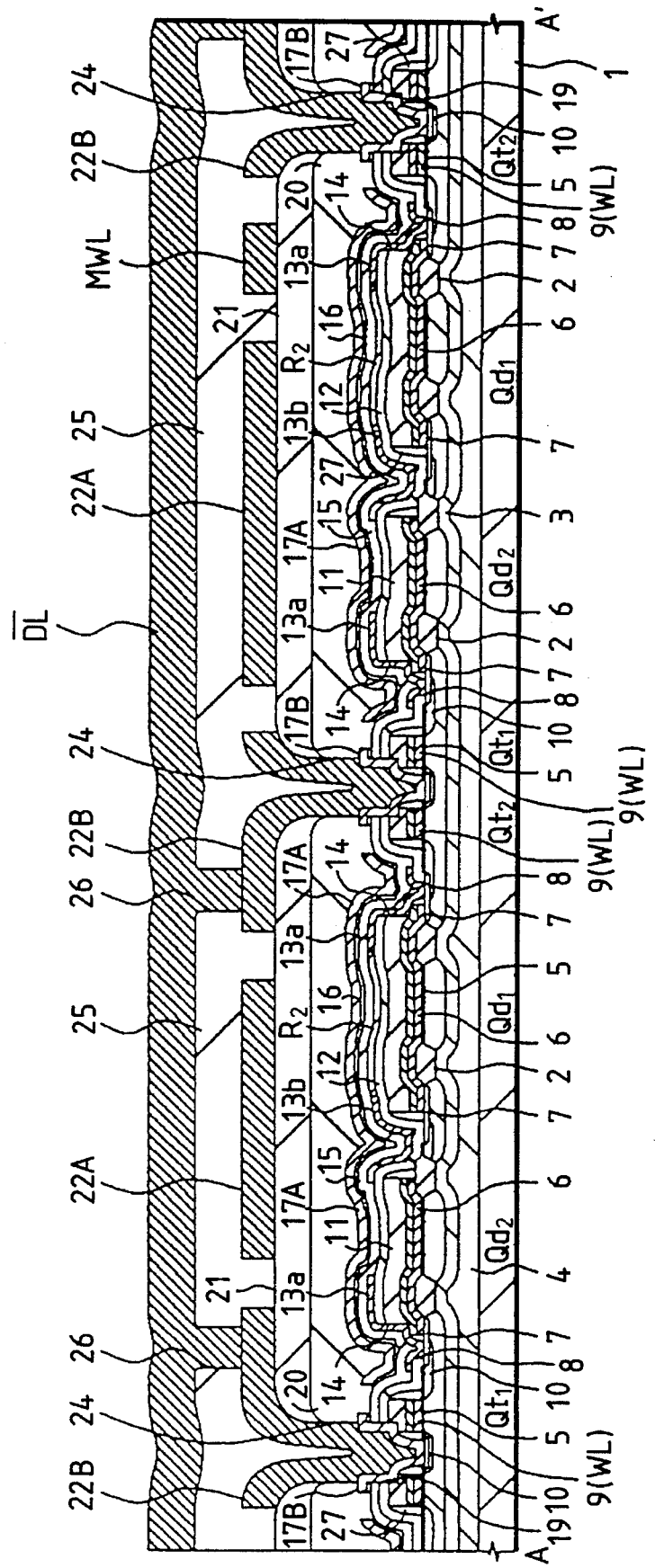
FIG. 5 is a sectional view of a semiconductor substrate along the line A—A' in FIGS. 3 and 4.

Concrete constitution of the memory cell will now be described with reference to FIGS. 3 to 10. FIGS. 3 and 4 are plan views illustrating thin electrically conducting layers for about 4 bits of memory cells (i.e., for about four memory cells) arranged along the direction in which the complementary data lines extend. For easy comprehension of the electrically conducting layers, they are shown being divided into a wiring layer (FIG. 4) and a lower electrically conducting layer (FIG. 3). FIG. 5 is a sectional view of a semiconductor substrate along the line A—A' (for about four bits of memory cells) of FIGS. 3 and 4, FIG. 6 is a sectional view along the line B—B' (for about two bits of memory cells), and FIG. 7 is a sectional view along the line C—C'.

Figure 6:
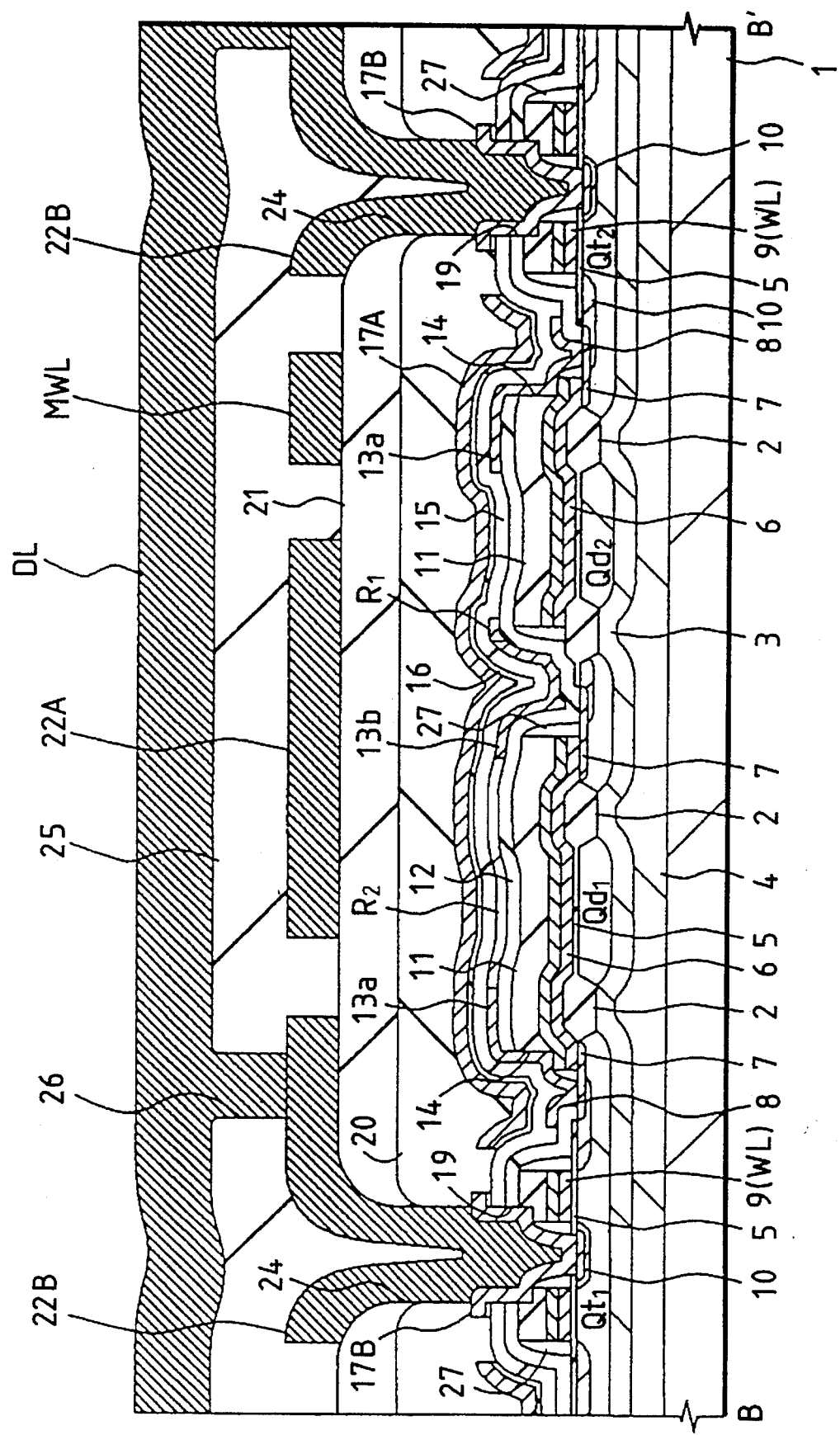
FIG. 6 is a sectional view of a semiconductor substrate along the line B—B' in FIGS. 3 and 4.

Referring to FIGS. 5 and 6, the memory cells are formed on the main surface of a semiconductor substrate 1 made of n$^-$-type single crystal silicon. The four MISFETs (drive MISFETs Qd1, Qd2 and transfer MISFETs Qt1, Qt2) in a memory cell are of the n-channel type, and are formed in an active region of a p-type well 4 of which the periphery is defined by a field oxide film 2 and a p-type channel stopper region 3.

The drive MISFETs Qd1, Qd2 are constituted by gate electrodes 6 formed on a gate oxide film 5 and a pair of n-type semiconductor regions 7, 7 (source region, drain region) formed in p-type wells 4 on both sides of the gate electrodes 6. The gate electrodes 6 of the drive MISFETs Qd1, Qd2 are connected to the drain regions (n-type semiconductor regions 7) of the other drive MISFETs Qd1, Qd2 through connection holes 8 formed in a silicon oxide film which is of the same layer as the gate oxide film 5.

The transfer MISFETs Qt1, Qt2 are constituted by gate electrodes 9 formed on the gate oxide film 5 and a pair of n-type semiconductor regions 10, 10 (source region, drain region) formed in p-type wells 4 on both sides of the gate electrodes 9. The gate electrodes 9 of the transfer MISFETs Qt1, Qt2 are each constituted integrally with the word lines WL.

Figure 8:
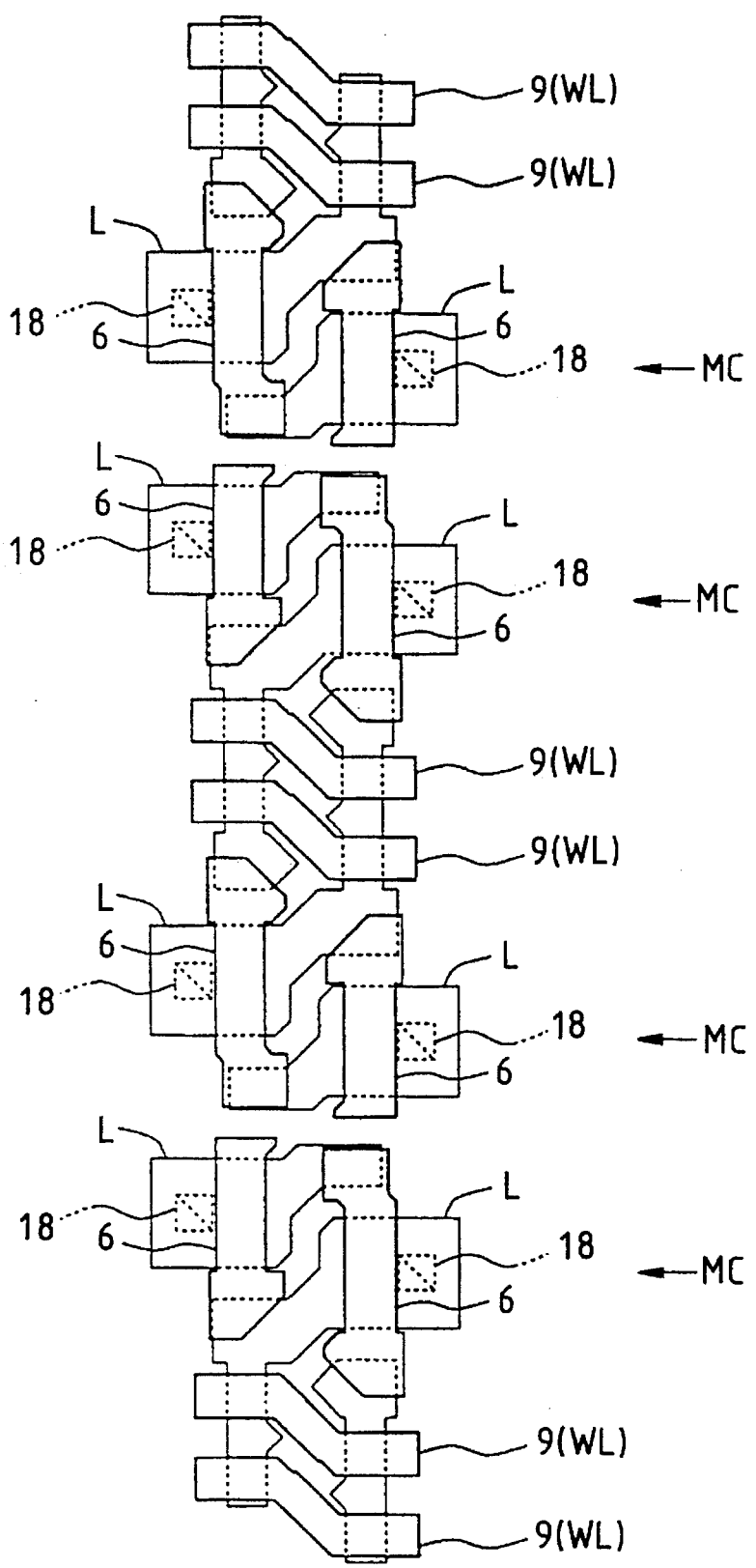
FIG. 8 is a plan view illustrating patterns of gate electrodes of drive MISFETs, gate electrodes of transfer MISFETs and word line for four memory cells along the direction of row.

The gate electrodes 6 of drive MISFETs Qd1, Qd2, the gate electrodes 9 of transfer MISFETs Qt1, Qt2, and the word lines WL are constituted by a polycrystalline silicon film (or a polycide film obtained by laminating a polycrystalline silicon film and a high-melting metal silicide film one upon the other) of a first layer in which are introduced n-type impurities (such as phosphorus (P)), and have patterns as shown in FIG. 8. In the drawing, symbol L denotes a pattern of an active region.

A silicon oxide film 11 is formed on the gate electrodes 6 of drive MISFETs Qd1, Qd2, on the gate electrodes 9 of transfer MISFETs Qt1, Qt2 and on the word lines WL. The silicon oxide film 11 has a thickness of, for example, 200 to 250 nm which is larger than the thickness of the polycrystalline silicon film (or polycide film) of the first layer.

The silicon oxide film 11 has the same plane pattern as the gate electrodes 6 of drive MISFETs Qd1, Qd2, gate electrodes 9 of transfer MISFETs Qt1, Qt2 and word lines WL. That is, after the silicon oxide film 11 is deposited on the polycrystalline silicon film (or polycide film) of the first layer by the CVD (chemical vapor deposition) method, the silicon oxide film 11 and the lower polycrystalline silicon film (or polycide film) of the first layer are patterned using the photoresist formed on the silicon oxide film 11 as a mask, thereby to form gate electrodes 6 of drive MISFETs Qd1, Qd2, gate electrodes 9 of transfer MISFETs Qt1, Qt2 and word lines WL.

A side wall spacer 27 is formed along the side walls of the silicon oxide film 11, gate electrodes 6 of drive MISFETs Qd1, Qd2, gate electrodes 9 of transfer MISFETs Qt1, Qt2 and word lines WL. The side wall spacer 27 is formed by patterning the silicon oxide film by anisotropic etching such as RIE (reactive ion etching) method, the silicon oxide film being deposited by, for example, the CVD method. A silicon oxide film 12 is formed on the silicon oxide film 11 and on the side wall spacer 27. The silicon oxide film 12 is deposited by, for example, the CVD method and has a thickness of 200 to 250 nm.

The high-resistance load elements R1, R2 of the memory cell are formed on the drive MISFETs Qd1, Qd2 via silicon oxide films 11 and 12. Low-resistance portions 13a, 13b are formed at both ends of each of the high-resistance load elements R1 and R2. The low-resistance portion 13a of the high-resistance load element R1 is connected to the gate electrode 6 of drive MISFET Qd2 through the connection hole 14 formed in the silicon oxide films 11 and 12, and is connected to the drain region (n-type semiconductor region 7) of drive MISFET Qd1 through the connection hole 8 formed in the silicon oxide film of the same layer as the gate oxide film 5.

The low-resistance portion 13a of the high-resistance load element R2 is connected to the gate electrode 6 of drive MISFET Qd1 through the connection hole 14 formed in the silicon oxide films 11 and 12, and is connected to the drain region (n-type semiconductor region 7) of drive MISFET Qd2 through the connection hole 8 formed in the silicon oxide film of the same layer as the gate oxide film 5. The low-resistance portion 13b of the high-resistance load element R2 constitutes a power source voltage line which extends along the direction of column. A power source voltage (Vcc) is applied to the high-resistance load elements R1, R2 via the low-resistance portion (power source voltage line) 13b.

Figure 9:
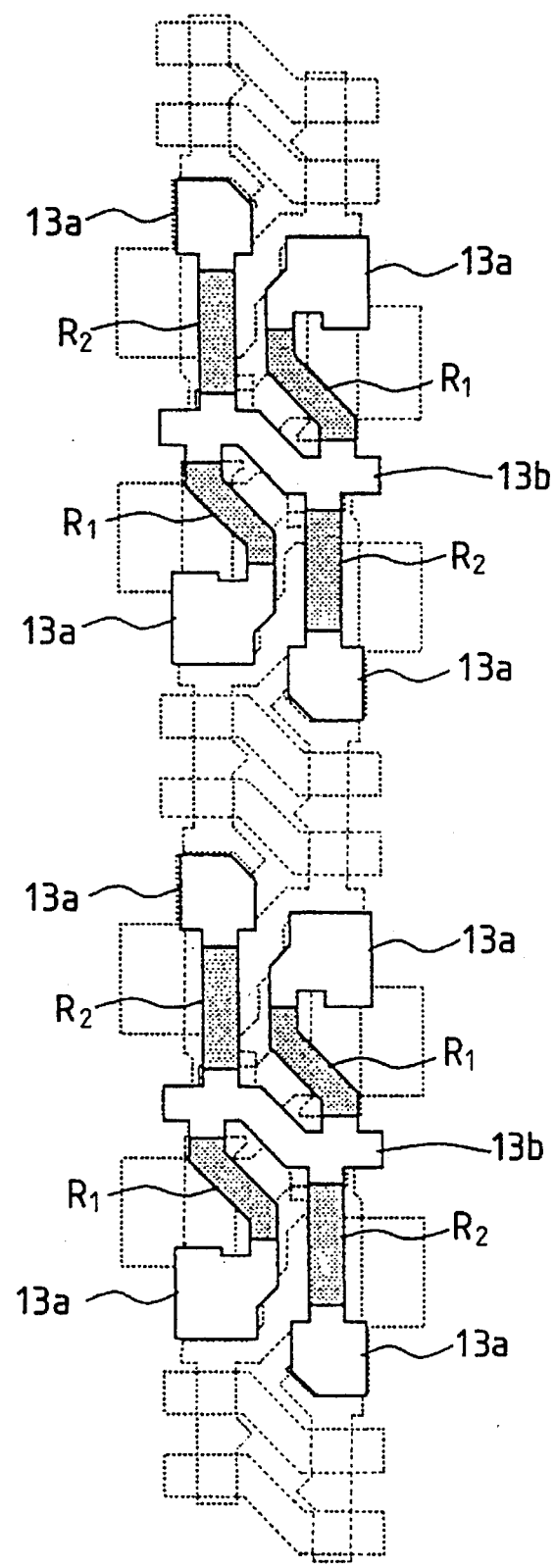
FIG. 9 is a plan view illustrating a pattern of high-resistance load elements.

The high-resistance load elements R1, R2 and the low-resistance portions 13a, 13b are constituted by the polycrystalline silicon films of the second layer describing patterns as shown in FIG. 9. The polycrystalline silicon films of the second layer have a thickness of, for example, from 80 to 120 mm. The polycrystalline silicon film constituting the low-resistance portions 13a, 13b contains n-type impurities (e.g., P) at a concentration higher than that of the polycrystalline silicon film constituting the high-resistance load elements R1, R2 exhibiting a resistance smaller than that of the high-resistance load elements R1, R2.

A ground voltage line 17A is formed on the high-resistance load elements R1, R2 and on the low-resistance portions 13a, 13b via a silicon nitride film 15 and a silicon oxide film 16. The ground voltage line (plate electrode) 17A is so arranged as to cover the high-resistance load elements R1, R2, low-resistance portions 13a, 13b and driving MISFETs Qd1, Qd2 of the lower layer. Therefore, the ground voltage line 17A has an increased width and exhibits a decreased wiring resistance.

In the memory cell MC of this embodiment, the high-resistance load elements R1, R2 are electrostatically shielded by the ground voltage line 17A thereby to prevent the amounts of current flowing into the high-resistance load elements R1, R2 from changing. In this memory cell, furthermore, a capacitance element C is constituted by the ground voltage line 17A (plate electrode), low-resistance portions 13a, 13b, and silicon nitride film 15 and silicon oxide film 16 interposed therebetween. The electric charge of the capacitance element C is fed to the charge-accumulating node of the memory cell MC to enhance resistance against soft error caused by a particles. The ground voltage line 17A and the low-resistance portion 13a constitute a pair of electrodes of the capacitance element C, and the silicon nitride film 15 and the silicon oxide film 16 constitute a dielectric film of the capacitance element C.

The silicon nitride film 15 has a thickness of, for example, from 16 to 24 nm and the silicon oxide film 16 has a thickness of, for example, from 35 to 45 nm. That is, the total thickness of the silicon nitride film 15 and the silicon oxide film 16 is from about 50 to about 70 nm, which is smaller than the thickness of the silicon oxide film 12 and the polycrystalline silicon film of the second layer.

The ground voltage line 17A is connected to the source regions (n-type semiconductor regions 7) of drive MISFETs Qd1, Qd2 via a connection hole 18 formed in the silicon oxide film 16, silicon nitride film 15, silicon oxide films 11, 12, and silicon oxide film of the same layer as the gate oxide film 5.

Figure 10:
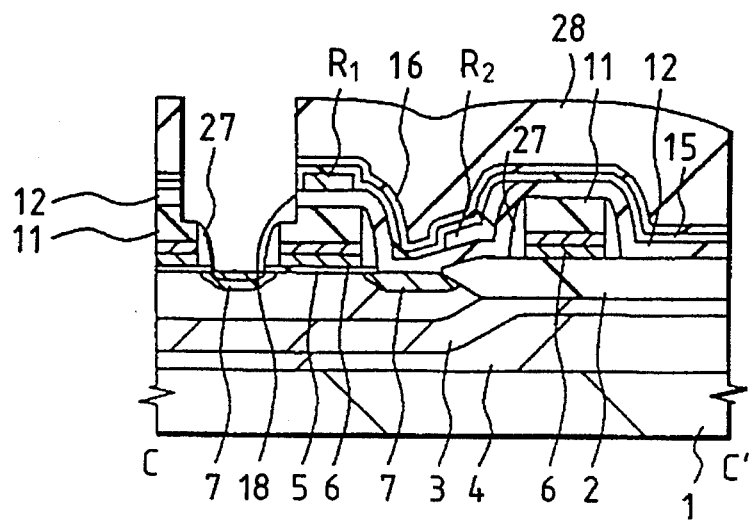
FIG. 10 is a sectional view of the semiconductor substrate along the line C—C' of FIGS. 3 and 4, illustrating a step for forming connection holes.

In order to form the connection hole 18, as shown in FIG. 10, a photoresist 28 is formed on the silicon oxide film 16. Then, using the photoresist 28 as a mask, the silicon oxide film 16 on the source regions (n-type semiconductor regions 7) of drive MISFETs Qd1, Qd2, silicon nitride film 15, silicon oxide films 11, 12, and silicon oxide film of the same layer as the gate oxide film 5, are anisotropically etched successively.

In this case, the silicon oxide film 11 on the gate electrodes 6 of drive MISFETs Qd1, Qd2 and the side wall spacer 27 on the side wall are cut by over-etching. By taking the amount of over-etching into consideration, here, the silicon oxide film 11 is thickly formed in order to prevent the gate electrodes 6 from being exposed. According to this embodiment, therefore, the silicon oxide film 11 is formed maintaining a thickness greater than that of the silicon oxide film 12.

Figure 11:
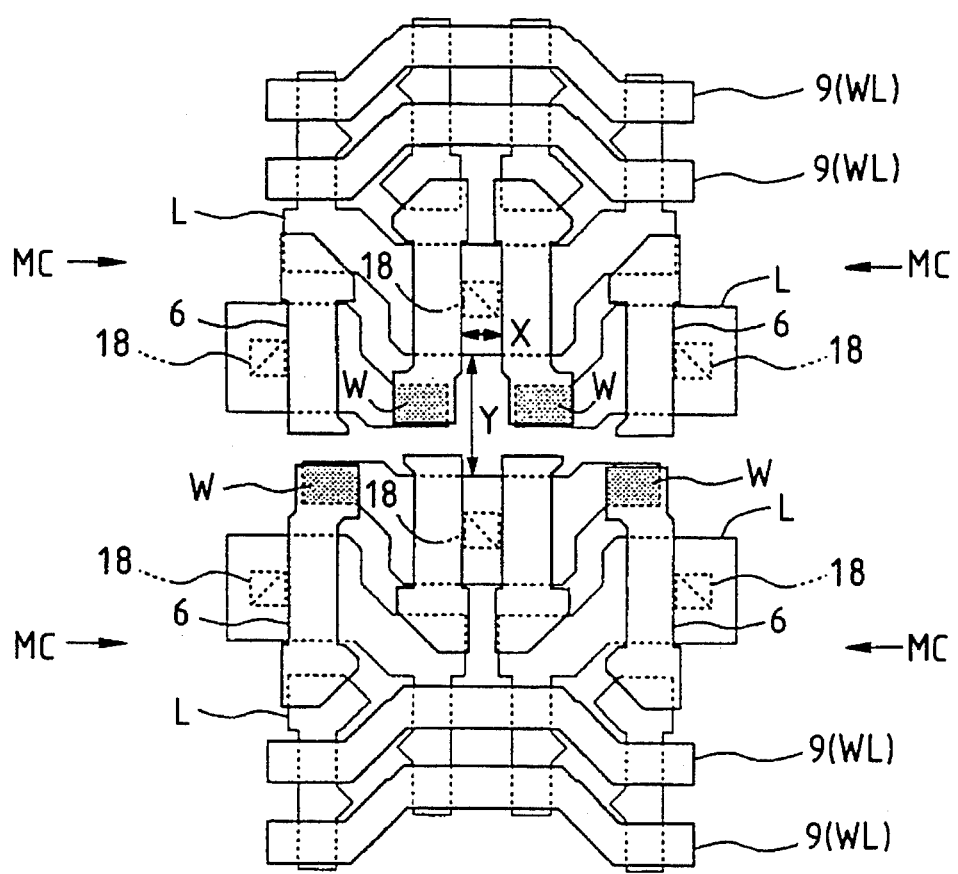
FIG. 11 is a plan view illustrating patterns of gate electrodes of driving MISFETs, gate electrodes of transfer MISFETs and word line for four memory cells along the directions of row and column.

The connection hole 18 has a width specified by the side wall spacer 27 in the direction of column (in which the word line WL extends). Therefore, no mask alignment is needed in the direction of column and the distance (X) can be shortened among the memory cells MC that are neighboring in the direction of column, as shown in FIG. 11. That is, the source regions (n-type semiconductor regions 7) of driving MISFETs Qd1, Qd2 and the ground voltage line 17A are formed via the connection hole 18 being self-aligned with respect to the silicon oxide film 11 and the side wall spacer 27, making it possible to decrease the margin for mask alignment in the direction of column when the connection hole 18 is being formed. This makes it possible to decrease the distance (X) among the memory cells MC neighboring in the direction of column and, hence, to fabricate the memory cells MC in a fine size.

On the other hand, a pad layer 17B constituted by the same electrically conducting layer as the above-mentioned ground voltage line 17A is formed on the drain regions (n-type semiconductor regions 10) of transfer MISFETs Qt1, Qt2. The pad layer 17B is connected to the drain regions (n-type semiconductor regions 10) of transfer MISFETs Qt1, Qt2 through a connection hole 19 formed in the silicon oxide film 16, silicon nitride film 15, silicon oxide films 11, 12, and silicon oxide film of the same layer as the gate oxide film 5.

Figure 12:
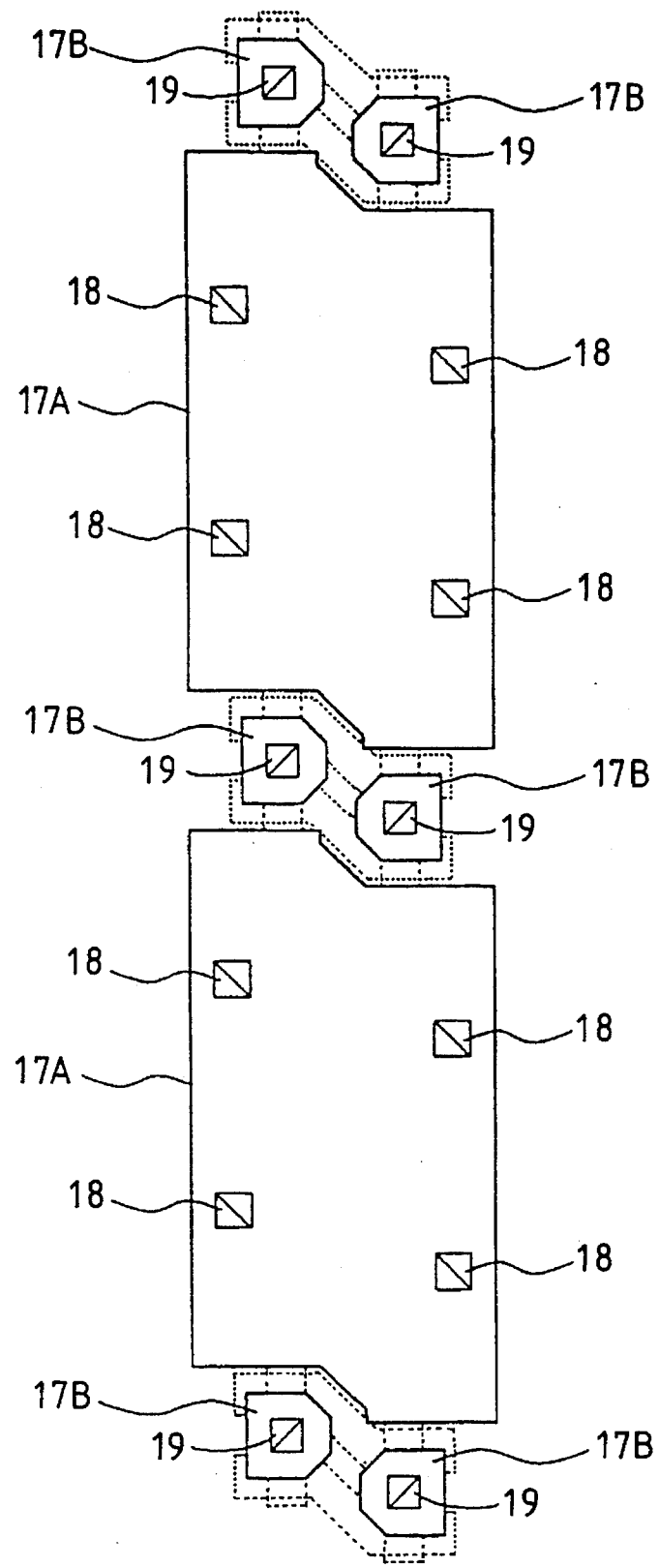
FIG. 12 is a plan view illustrating patterns of plate electrodes (ground voltage lines) and pad layers.

The ground voltage line 17A and the pad layer 17B are constituted by a polycrystalline silicon film (or a polycide film obtained by laminating a polycrystalline silicon film and a high-melting metal silicide film one upon the other) of a third layer into which are introduced n-type impurities (e.g., P), describing patterns as shown in FIG. 12. The polycrystalline silicon film (or polycide film) of the third layer has a thickness of, for example, 120 to 180 nm. N-type impurities are introduced into the polycrystalline silicon film by either the ion implantation method or the phosphorus treatment method.

On the ground voltage line 17A and on the pad layer 17B are formed a ground voltage line 22A for shunting, a pad layer 22B and a main word line MWL via a silicon oxide film 20 and a BPSG (boron doped phosphosilicate glass) film 21. The silicon oxide film 20 has a thickness of, for example, from 80 to 120 nm, and the BPSG film 21 has a thickness of, for example, from 400 to 500 nm. The BPSG film 21 is deposited by, for example, the CVD method, and is then heat-treated (annealed) at a temperature of as high as about 850° to 1000° C. to flatten the surface in order to decrease steps under the ground voltage line 22A for shunting, pad layer 22B and main word line MWL. The ground voltage line 22A for shunting, main word line MWL and pad layer 22B are constituted by an Al (aluminum) wiring of a first layer comprising a laminate of, for example, an $MoSi_x$ (molybdenum silicide film) film, an aluminum alloy (Al-Si-Cu) film and an $MoSi_x$ film.

The ground voltage lines 22A for shunting are arranged at a rate of one line per two bits of memory cells MC that are arranged along a direction in which the complementary data lines (data line DL, data line bar DL) extend, and extend in a direction to intersect the direction in which the complementary data lines extend and are connected to a plurality of memory cells MC. The main word lines MWL are arranged at a rate of one line per 4 bits of memory cells MC arranged along the direction in which the complementary data lines extend, and extend in a direction to intersect the direction in which the complementary data lines extend. The pad layers 22B are arranged at a rate of one per 2 bits of memory cells MC arranged along the direction in which the data line extends. That is, the ground voltage line 22A for shunting, main word line MWL and pad layer 22B are arranged in a recurring pattern of pad layer 22B, ground voltage line 22A for shunting, pad layer 22B, ground voltage line 22A for shunting and main word line MWL every four bits (pieces) of memory cells MC arranged along the direction in which the complementary data lines extend.

The ground voltage line 22A for shunting is connected to the ground voltage line 17A via a connection hole 23 formed in the BPSG film 21 and the silicon oxide film 20. As described earlier, the ground voltage line 17A is connected to the source regions (n-type semiconductor regions 7) of drive MISFETs Qd1, Qd2 via the connection holes 18. That is, the source regions (n-type semiconductor regions 7) of drive MISFETs Qd1, Qd2 are connected to the ground voltage lines 22A for shunting via the pad layers constituted by the ground voltage lines 17A, and are fixed to ground potential (GND).

The pad layers 22B are connected to the pad layers 17B via connection holes 24 formed in the BPSG film 21 and the silicon oxide film 20. The main word line MWL is connected to the word lines WL in the word decoder WDEC which is disposed neighboring the memory mat MAT.

Since the underlying BPSG film 21 has a flat surface, the connection holes 23 for the ground voltage lines 22A for shunting can be disposed just above the connection holes 18. This helps shorten the distance of connection between the ground voltage lines 22A for shunting and the source regions (n-type semiconductor regions 7) of drive MISFETs Qd1, Qd2, whereby parasitic resistance of the wiring (ground voltage lines 22A for shunting) decreases, and the source regions (n-type semiconductor regions 7) are reliably fixed to ground potential (GND).

In this embodiment, furthermore, the ground voltage lines 22A for shunting are connected to the source regions (n-type semiconductor regions 7) of drive MISFETs Qd1, Qd2 via the ground voltage lines 17A (plate electrodes) of a large area covering the high-resistance load elements R1, R2. Therefore, the source regions (n-type semiconductor regions 7) of drive MISFETs Qd1, Qd2 are connected to the ground voltage lines 17A in a self-aligned manner, making it possible to fully ensure fitting margin between the gate electrodes 6 of drive MISFETs Qd1, Qd2 and the connection holes 18 formed on the source regions (n-type semiconductor regions 7).

That is, as shown in FIG. 11, the connection holes 18 are arranged among the gate electrodes 6 of drive MISFETs (Qd) of memory cells MC neighboring in the direction of column, and whereby it is possible to ensure a sufficient space (Y) among the source regions (n-type semiconductor regions 7) of drive MISFETs (Qd) neighboring in the direction of row and, hence, to increase the contact areas (W) between the gates 6 of drive MISFETs Qd1, Qd2 and the drain regions (n-type semiconductor regions 7) of the other drive MISFETs Qd1, Qd2. Accordingly, even when the memory cells MC are fabricated in fine sizes, the connection resistance is maintained small between the gate electrodes 6 of drive MISFETs Qd1, Qd2 and the drain regions (n-type semiconductor regions 7) of the other drive MISFETs Qd1, Qd2, enabling the operation of memory cells MC to be stabilized.

Complementary data lines (data line DL, data line bar DL) are formed on the ground voltage line 22A for shunting, on the pad layer 22B and on the main word line MWL via an interlayer insulating film 25. The interlayer insulating film 25 is constituted by a laminate of, for example, a silicon oxide film, a spin-on-glass film and a silicon oxide film, and has a thickness of, for example, from 900 to 1200 nm. The complementary data lines are constituted by an Al (aluminum) wiring of the second layer comprising a laminate of, for example, an $MoSi_x$ (molybdenum silicide) film, an aluminum alloy (Al-Si-Cu) film and an $MoSi_x$ film. That is, in the memory cell of this embodiment, the ground voltage lines 22A for shunting, pad layers 22B and main word line MWL are constituted by the Al wiring of the first layer, and the complementary data lines (data line DL, data line bar DL) are constituted by the Al wiring of the second layer.

The complementary data lines (data line DL, data line bar DL) are connected to the pad layers 22B via connection holes 26 formed in the interlayer insulating film 25. As described above, the pad layers 22B are connected to the pad layers 27B via connection holes 24, and are further connected to the drain regions (n-type semiconductor regions 10) of transfer MISFETs Qt1, Qt2 via connection holes 19. Therefore, one of the complementary data lines is connected to the drain region (n-type semiconductor region 10) of transfer MISFET Qt1 via connection hole 26, pad layer 22B, connection hole 24, pad layer 17B and connection hole 19, and the other one of the complementary data lines is connected to the drain region (n-type semiconductor region 10) of transfer MISFET Qt2 via connection hole 26, pad layer 22B, connection hole 24, pad layer 17B and connection hole 19.

Here, the interlayer insulating film 25 is deposited after the Al wiring of the first layer is formed, and must be heat-treated (annealed) at a temperature of as low as not higher than about 450° C. in order to flatten the surface thereof. That is, the interlayer insulating film 25 cannot be flattened by the heat treatment (annealing). Here, if the connection holes 26 are disposed just above the connection holes 24, the connection holes 26 become too deep since the pad layers 22B enter the connection holes 24, whereby coverage of the Al wiring of the second layer decreases, and it becomes difficult to maintain connection of the Al wiring of the second layer to the Al wiring of the first layer. It is not therefore recommended to dispose the connection holes 26 just above the connection holes 24.

Referring to FIG. 4, in the memory cell of this embodiment, the arrangement of connection holes 24, 26 in the pad layer 22B connected to one of the complementary data lines (data line DL) and the arrangement of connection holes 24, 26 in the pad layer 22B connected to the other one (data line bar DL) of the complementary data lines, are reversed every two bits of memory cells arranged along the direction (direction of row) in which the complementary data lines (data line DL, data line bar DL) extend. That is, the arrangement of connection holes 24, 26 in the pad layer 22B (first pad layer) connected to one of the data lines DL is compared with the arrangement of connection holes 24, 26 in the pad layer 22B (second pad layer) connected to the other data line bar DL in the following: In the pair of right and left pad layers 22B (first and second pad layers) on the upper side of FIG. 4, the connection holes 24 are on the upper side and the connection holes 26 are on the lower side. In the pair of right and left pad layers 22B at the central portion, the arrangement of connection holes 24, 26 in the pad layer 22B (first pad layer) of the left side is inverted from that in the pad layer 22B (second pad layer) of the right side. In the pair of right and left pad layers 22B (first and second pad layers) of the lower side, the connection holes 24 are on the upper side and the connection holes 26 are on the lower side.

Figure 13:
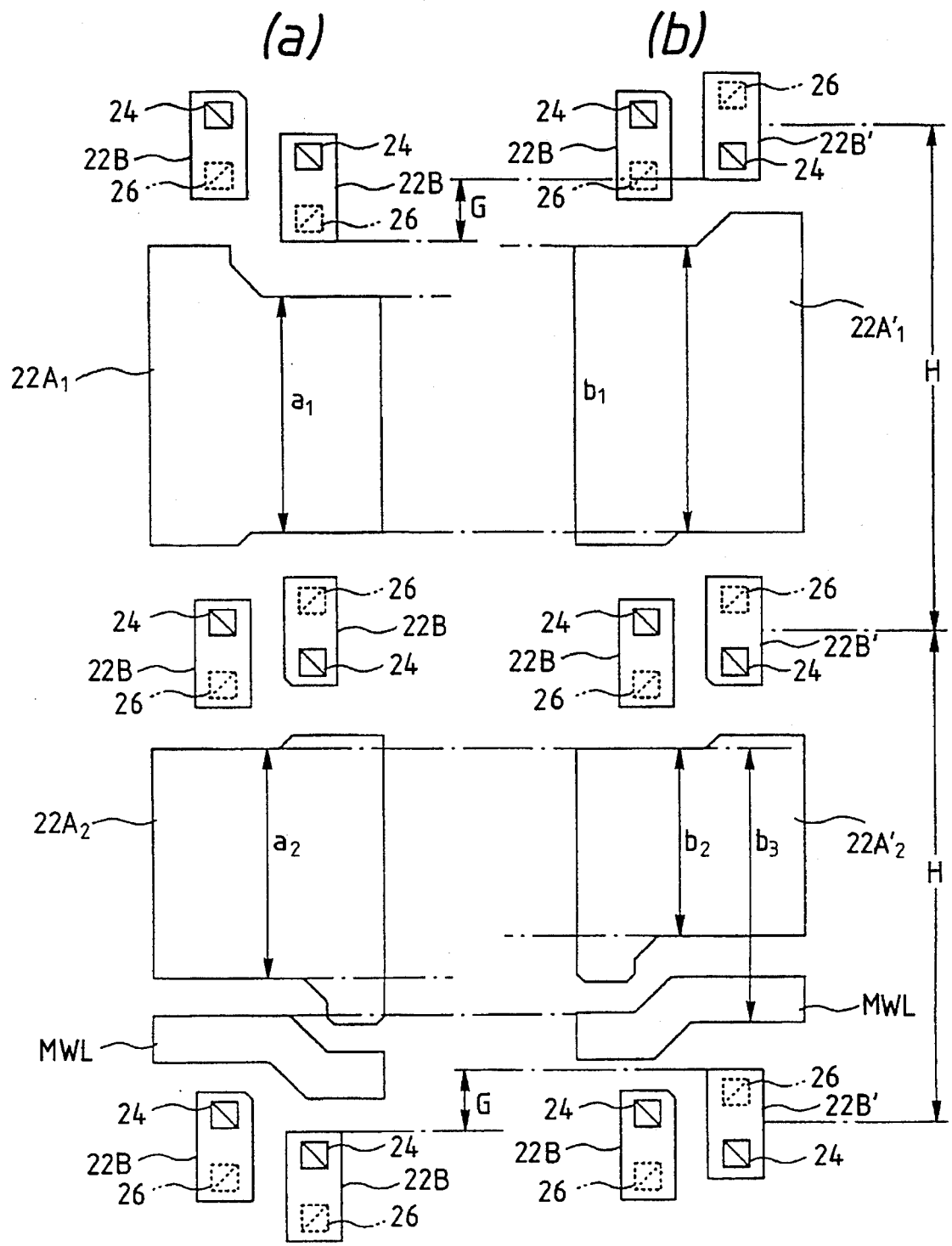
FIG. 13(a) is a plan view illustrating the width of a ground voltage line for shunting according to the present invention.
FIG. 13(b) is a plan view illustrating the width of a ground voltage line for shunting according to a comparative example.

The width of the ground voltage line 22A for shunting in this case is as shown in FIG. 13(a). Of the two ground voltage lines $22A_1$, $22A_2$ for shunting as shown in FIG. 13(a), a minimum width of the ground voltage line $22A_1$ for shunting sandwiched between the pad layer 22B and the pad layer 22B is $a_1$, and a minimum width of the ground voltage line $22A_2$ for shunting sandwiched between the pad layer 22B and the main word line MWL is $a_2$.

In a comparative example shown in FIG. 13(b), on the other hand, the arrangement of connection holes 24, 26 in the pad layer 22B connected to one of the complementary data lines and the arrangement of connection holes 24, 26 in the pad layer 22B connected to the other one of the complementary data lines, remain constant. Here, the positions of connection holes 24 shown in FIG. 13(a) are the same as the positions of connection holes 24 shown in FIG. 13(b), and the pad layer 22B' of the right side of FIG. 13(b) that is downwardly moved by a distance G corresponds to the position of the pad layer 22B of the right side of FIG. 13(a).

That is, in the pad layer 22B of the left side of FIG. 13(b), the connection holes 24 are all on the upper side and the connection holes 26 are all on the lower side and in the pad layer 22B of the right side, the connection holes 26 are all on the upper side and the connection holes 24 are all on the lower side. Therefore, the gap (H) between the pad layer 22B and the pad layer 22B that are neighboring in the direction of row is the same as the gap (H) between the pad layer 22B' and the pad layer 22B'. In this case of the two ground voltage lines $22A'_1$ and $22A'_2$, the ground voltage line $22A'_1$ for shunting sandwiched between the pad layer 22B and the pad layer 22B has a minimum width $b_1$, and the ground voltage line $22A'_2$ for shunting sandwiched between the pad layer 22B and the main word line MWL has a minimum width $b_2$.

Here, the ground voltage lines $22A_1$, $22A_2$ for shunting of this embodiment will be compared with the ground voltage lines $22A'_1$, $22A'_2$ of comparative example in regard to their minimum line widths.

First, a minimum width ($a_1$) of the ground voltage line $22A_1$ for shunting sandwiched between the pad layer 22B and the pad layer 22B is compared with a minimum width ($b_1$) of the ground voltage line $22A'_1$ for shunting. As will be obvious from the drawing, the minimum width ($b_1$) of the ground voltage line $22A'_1$ for shunting is larger than the minimum width ($a_1$) of the ground voltage line $22A_1$ for shunting ($b_1 > a_1$).

On the other hand, when a minimum width ($a_2$) of the ground voltage line $22A_2$ for shunting sandwiched between the pad layer 22B and the main word line MWL is compared with a minimum width ($b_2$) of the ground voltage line $22A'_2$ for shunting the minimum width ($a_2$) of the ground voltage line $22A_2$ for shunting is larger than the minimum width ($b_2$) of the ground voltage line $22A'_2$ for shunting ($a_2 > b_2$) as is obvious from the drawing. Moreover, the minimum width ($a_1$) of the ground voltage line $22A_1$ for shunting is nearly equal to the minimum width ($a_2$) of the ground voltage line $22A_2$ for shunting ($b_1 > a_1 \doteq a_2 > b_2$).

Referring to FIGS. 13(a) and 13(b), if it is assumed that the gaps remain constant among the pad layers 22B, 22B', ground voltage lines for shunting $22A_1$, $22A_2$, $22A'_1$, $22A'_2$, and main word line MWL, the virtual line width $b_3$ becomes equal to the minimum width ($b_1$) of the ground voltage line $22A'_1$ for shunting ($b_1 = b_3$). In this case, the minimum width ($a_1$) of the ground voltage line $22A_1$ for shunting of the embodiment shown in FIG. 13(a) becomes equal to a value obtained by subtracting the distance (G) by which the pad layer 22B' of FIG. 13(b) has moved in the direction of column from the minimum width ($b_1$) of the ground voltage line $22A'_1$ for shunting. As is obvious from FIG. 13(b), therefore, even when the distance (G) of movement is subtracted from the above-mentioned virtual line width $b_3$, the resulting value becomes larger than the minimum width ($b_2$) of the ground voltage line $22A'_2$ for shunting and, hence, the minimum width ($a_1$) of the ground voltage line $22A_1$ for shunting becomes larger than the minimum width ($b_2$) of the ground voltage line $22A'_2$ for shunting.

From the above fact, when sizes of the ground voltage lines $22A_1$, $22A_2$ for shunting of this embodiment and the ground voltage lines $22A'_1$, $22A'_2$ of comparative example are decreased at the same rate, the ground voltage line $22A'_2$ for shunting of comparative example having the smallest minimum line width exhibits the greatest GND resistance. Besides, aluminum constituting the ground voltage line $22A'_2$ for shunting exhibits the least resistance against electromigration.

According to this embodiment in which the arrangement of connection holes 24, 26 in the pad layer 22B connected to one of the complementary data lines in inverted from the arrangement of connection holes 24, 26 in the pad layer 22B connected to the other one of the complementary data lines every two bits of memory cells arranged along the direction in which the complementary data lines extend, it is made possible to minimize the increase in the GND resistance when the ground voltage lines $22A_1$, $22A_2$ for shunting are formed in a fine size and to minimize the drop in the resistance against electromigration and, hence, to increase the operation speed of the memory cells and to decrease the size thereof.

Embodiment 2

Figure 14:
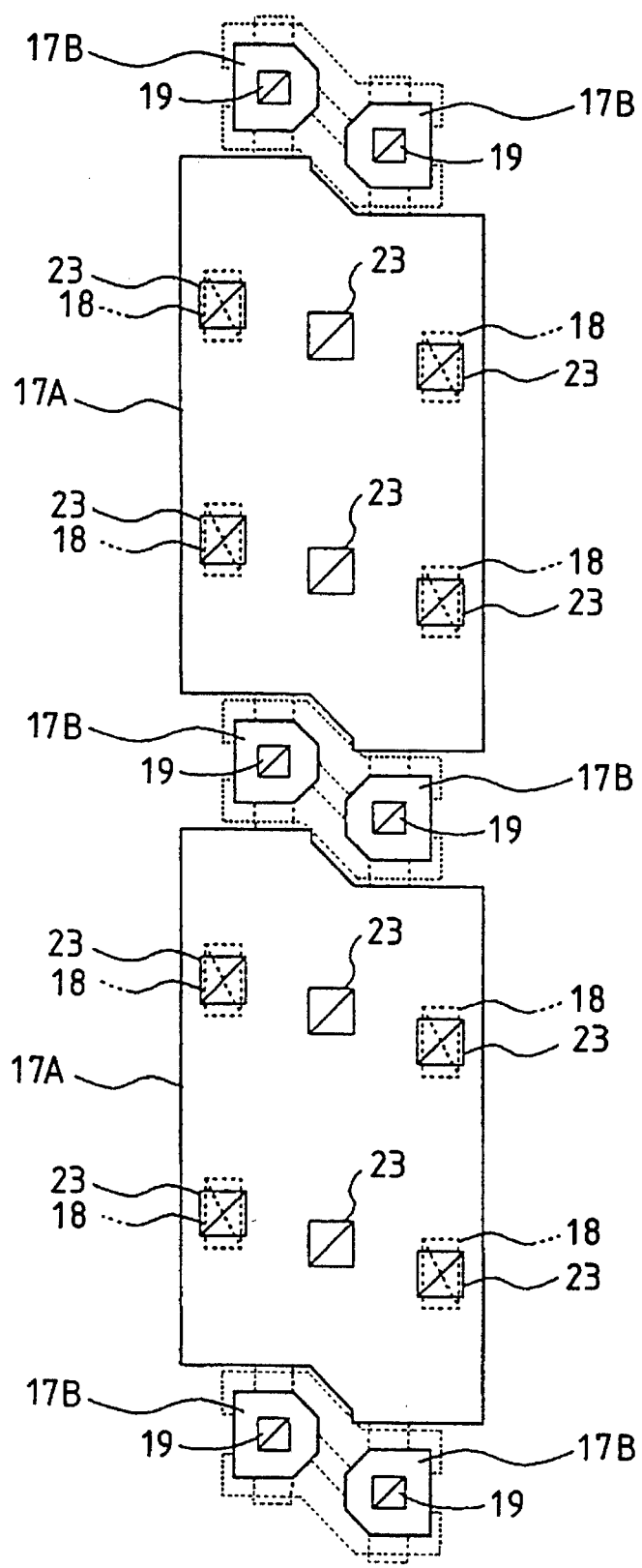
FIG. 14 is a plan view illustrating the layout of connection holes arranged at upper portions and lower portions of the plate electrodes (ground voltage lines) according to another embodiment of the present invention.

FIG. 14 is a plan view illustrating patterns of the connection holes 23 formed in the upper part of the ground voltage lines 17A of the memory cell and the connection holes 18 formed in the lower part thereof according to embodiment 2.

As described in embodiment 1 above, the ground voltage lines 22A for shunting constituted by the Al wiring of the first layer are connected to the ground voltage lines 17A of the lower layer through the connection holes 23, and are further connected to the source regions (n-type semiconductor regions 7) of drive MISFETs Qd1, Qd2 via connection holes 18.

In this embodiment 2 as shown in FIG. 14, the number of the connection holes 23 for connecting the ground voltage lines 22A for shunting to the ground voltage lines 17A is larger than the number of the connection holes 18, and the connection holes 23 are formed even in a region where there is no connection hole 18. This constitution makes it possible to increase the contact area between the ground voltage lines 22A for shunting and the ground voltage lines 17A and, hence, to decrease the GND resistance.

According to this embodiment 2 as shown in FIG. 14, furthermore, the connection holes 18 have a rectangular shape on a plane. This constitution makes it possible to increase the contact area between the ground voltage lines 17A and the source regions (n-type semiconductor regions 7) of drive MISFETs Qd1, Qd2 and, hence, to further decrease the GND resistance.

In the foregoing was concretely described the invention accomplished by the present inventors by way of embodiments. It should, however, be noted that the present invention is in no way limited to the above-mentioned embodiments only but can be modified in a variety of other ways without departing from the gist and scope of the invention.

Briefly described below are the effects obtained by representative examples of the invention disclosed in this application.

(1) According to the present invention, it is possible to minimize the increase of GND resistance and the drop of resistance against electromigration when the ground voltage lines for shunting are constituted by an Al wiring in a fine structure and, hence, to realize an SRAM in a fine structure.

(2) According to the present invention, it is possible to increase the contact area between the gate electrode of one drive MISFET and the drain region of the other drive MISFET and, hence, to realize the SRAM in a fine structure.

(3) According to the present invention, it is possible to increase the contact area between the plate electrodes and the grounding voltage lines of the upper layer and, hence, to decrease the GND resistance.

(4) According to the present invention, high-resistance load elements are electrostatically shielded by the ground voltage lines in order to prevent the amounts of current flowing into the high-resistance load elements from changing, making it possible to decrease the amount of electric power consumed by the SRAM.

(5) According to the present invention, a capacitance element is constituted by the ground voltage lines, low-resistance portions of the high-resistance load elements, and an insulating film disposed therebetween, making it possible to increase resistance of the memory cells against soft error caused by a particles.

(6) According to the present invention, the complementary data lines constituted by the Al wiring of the second layer are connected to the drain regions of transfer MISFETs via pad layers constituted by the Al wiring of the first layer and pad layers constituted by the lower electrically conducting layer, contributing to enhancing reliability in the connection of complementary data lines.

(7) According to the present invention, the main word line and the ground voltage lines for shunting are constituted by the Al wiring of the first layer, and the data lines are constituted by the Al wiring of the second layer, enabling the data writing operation and reading operation to be executed at high speeds.

What is claimed is:

1. A semiconductor integrated circuit device wherein:
   a memory cell of an SRAM is constituted by a flip-flop circuit and two transfer MISFETs arranged at a portion where a word line and a pair of complementary data lines intersect each other;
   a metal wiring of a first layer formed above said memory cell constitutes ground voltage lines, pad layers, and a main word line that is arranged at a rate of one line per four memory cells arranged along a first direction parallel to a direction in which said complementary data lines extend;
   said complementary data lines are constituted by a metal wiring of a second layer formed above the metal wiring of said first layer;
   said complementary data lines and said pad layers are electrically connected together through first connection holes formed in an interlayer insulating film that is formed between said complementary data lines and said pad layers, and said pad layers and either the source regions or the drain regions of said transfer MISFETs are electrically connected together through second connection holes formed in an insulating film that is formed between said pad layers and said transfer MISFETs; and wherein,
   the arrangement of said first and second connection holes in said pad layer connected to one of said complementary data lines and the arrangement of said first and second connection holes in said pad layer connected to the other one of said complementary data lines, are inverted from each other every two memory cells that are arranged along the first direction.

2. A semiconductor integrated circuit device according to claim 1, wherein the metal wirings of said first layer and said second layer are aluminum wirings.

3. A semiconductor integrated circuit device according to claim 1, wherein the memory cells neighboring in said first direction are connected to said complementary data lines via the same pad layer which is formed every two memory cells in said first direction.

4. A semiconductor memory device wherein:
   a memory cell of an SRAM is constituted by a flip-flop circuit and two transfer MISFETs arranged at a portion where a word line and a pair of complementary data lines intersect each other;
   ground voltage lines and first and second pad layers are constituted by a first wiring layer formed above said memory cell;
   said complementary data lines are constituted by a second wiring layer formed above said ground voltage lines and said pad layers;
   said complementary data lines and said pad layers are electrically connected together via first connection holes formed in an interlayer insulating film between said complementary data lines and said pad layers, and said pad layers and either the source regions or the drain regions of said transfer MISFETs are electrically connected together via the second connection holes formed in an insulating film between said pad layers and said transfer MISFETs; and
   the arrangement of said first and second connection holes in said first pad layers connected to one of said complementary data lines and the arrangement of said first and second connection holes in said second pad layers connected to the other one of said complementary data lines, are inverted from each other in said second pad layers that are neighboring in a first direction in parallel with the direction in which said complementary data lines extend, but remain the same in said first pad layers that are neighboring in said first direction.

5. A semiconductor memory device according to claim 4, wherein the memory cells neighboring in said first direction are connected to the same first and second pad layers which are formed every two memory cells in said first direction.

6. A semiconductor memory device according to claim 5, wherein said main word line is formed at a rate of one line per four memory cells arranged a long said first direction.

7. A semiconductor integrated circuit device wherein:
   a memory cell of an SRAM is constituted by two transfer MISFETs and a flip-flop circuit made up of two drive MISFETs and two load elements;
   said memory cells are arranged in a direction of row and in a direction of column;
   the gate electrodes of said drive MISFETs are formed above a semiconductor substrate;
   the source and drain regions of said drive MISFETs are formed in said semiconductor substrate;
   a first insulating film is formed on the gate electrodes of said drive MISFETs;
   a side wall spacer is formed on the side walls of the gate electrodes of said drive MISFETs and of said first insulating film;
   semiconductor strips are formed above said first insulating film;
   each of said semiconductor strips has a first region and a second region, as well as a third region which has a resistance larger than those of said first and second regions and is formed between said first region and said second region;
   said third region works as said load element;
   said first region is electrically connected to the drain regions of said drive MISFETs;
   plate electrodes are formed above said semiconductor strips so as to cover said semiconductor strips;
   said plate electrodes are electrically connected to the source regions of said drive MISFETs;
   a dielectric film is formed between said plate electrodes and said semiconductor strips;
   a capacitor element is constituted by said plate electrodes, said semiconductor strips and said dielectric film; and
   the first connection holes for connecting said plate electrodes to the source regions of said drive MISFETs are defined for their widths in the direction of column by said side wall spacer between the gate electrodes of drive MISFETs of memory cells that are neighboring in said direction of column.

8. A semiconductor integrated circuit device according to claim 7, wherein a power source line is formed above said plate electrodes, said power source line being formed of a metal wiring and being electrically connected to said plate electrodes, and the second connection holes for connecting said power source line to said plate electrodes are disposed above said first connection holes.

9. A semiconductor integrated circuit device according to claim 7, wherein a power source line is formed above said plate electrodes, said power source line being formed of a metal wiring and being electrically connected to said plate electrodes, and the number of the second connection holes for connecting said power source line to said plate electrodes is larger than the number of said first connection holes.

10. A semiconductor integrated circuit device according to claim 7, wherein said first connection holes are rectangular in plan view.

\* \* \* \* \*